United States Patent
Ning

(10) Patent No.: US 7,663,159 B2
(45) Date of Patent: Feb. 16, 2010

(54) SEAL RING CORNER DESIGN

(75) Inventor: Xian J. Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 182 days.

(21) Appl. No.: 11/245,339

(22) Filed: Oct. 5, 2005

(65) Prior Publication Data

US 2007/0069336 A1    Mar. 29, 2007

(30) Foreign Application Priority Data

Sep. 28, 2005  (CN) .................... 2005 1 0030304

(51) Int. Cl.
  *H01L 29/74* (2006.01)
(52) U.S. Cl. ................ 257/127; 257/170; 257/E23.001
(58) Field of Classification Search ................ 257/688, 257/630, 710, 758, E23.001, E23.194, 127, 257/760, 773, 666, 170
See application file for complete search history.

(56) References Cited

U.S. PATENT DOCUMENTS

| | | | |
|---|---|---|---|
| 6,028,347 A | 2/2000 | Sauber et al. | |
| 6,362,524 B1 | 3/2002 | Blish et al. | |
| 6,412,786 B1 | 7/2002 | Pan | |
| 6,509,622 B1 | 1/2003 | Ma et al. | |
| 2004/0043609 A1* | 3/2004 | Yamamoto | 438/675 |
| 2006/0055005 A1* | 3/2006 | Furusawa et al. | 257/635 |

* cited by examiner

*Primary Examiner*—Davienne Monbleau
*Assistant Examiner*—Hoa B Trinh
(74) *Attorney, Agent, or Firm*—Townsend and Townsend and Crew LLP

(57) ABSTRACT

Techniques for an integrated circuit device are provided. The integrated circuit device includes a substrate, an active circuit area, and a dielectric layer. A seal ring surrounds the active circuit area. At least one corner area of the integrated circuit includes a plurality of corner band stacks. Each of the plurality of corner band stacks is oriented at about a predetermined angle and extends from a first sawing trace to a second sawing trace. In a specific embodiment, if a structural fault in the at least one corner area occurs, the structural fault is predisposed to extend at about the predetermined angle.

18 Claims, 2 Drawing Sheets

SEAL RING CORNER DESIGN

BACKGROUND OF THE INVENTION

The present invention is directed to integrated circuits and their processing for the manufacture of semiconductor devices. More particularly, the invention provides techniques for a corner structure to protect an integrated circuit from delamination and cracking during die sawing and packaging. Merely by way of example, the invention has been applied to the manufacture of advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

For example, manufacturing processes often subject an integrated circuit to mechanical stresses, such as during sawing or packaging. These stresses can cause cracking or delamination. This problem is especially pronounced at interfaces that included materials having significantly different thermal expansion properties, such as between a low k dielectric material and copper.

Accordingly, conventional seal ring techniques have been proposed. These techniques provide a protective barrier around an active region of a chip. Unfortunately, conventional seal ring techniques have certain limitations. For example, a conventional seal ring is generally not sufficiently robust to protect a corner of a chip during the sawing process. A broken corner can initiate many cracks and delamination areas in the conventional seal ring that propagate into an active region of a chip. These and other limitations may be found throughout the present specification and more particularly below.

From the above, it is seen that an improved technique for semiconductor devices is desired.

BRIEF SUMMARY OF THE INVENTION

According to the present invention is directed to integrated circuits and their processing for the manufacture of semiconductor devices. More particularly, the invention provides techniques for a corner structure to protect an integrated circuit from delamination and cracking during die sawing and packaging. Merely by way of example, the invention has been applied to the manufacture of advanced integrated circuit devices, but it would be recognized that the invention has a much broader range of applicability.

In a specific embodiment, the present invention provides an integrated circuit device. The device includes a substrate, an active circuit area, and a dielectric layer overlying the substrate. A seal ring is disposed in the dielectric layer and surrounds the active circuit area as a protective boundary. At least one corner area of the integrated circuit includes a plurality of corner band stacks. Each of the plurality of corner band stacks is oriented at about a predetermined angle and extends from a first sawing trace to a second sawing trace. If a structural fault in the at least one corner area occurs, the structural fault is predisposed to extend at about the predetermined angle In another embodiment, a corner band stack, includes a first metal layer, a second metal layer aligned below the first metal layer, and a first via coupling the first metal layer and the second metal layer. The corner band stack extends from a first sawing trace to a second sawing trace at a predetermined angle.

Many benefits are achieved by way of the present invention over conventional techniques. For example, the present technique provides an easy to implement corner structure that relies upon conventional technology. Additionally, the techniques are compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention is directed to integrated circuits and their processing for the manufacture of semiconductor devices. More particularly, the invention provides techniques for a corner structure to protect an integrated circuit from delamination and cracking during die sawing and packaging. Merely by way of example, the invention has been applied to the manufacture of advanced integrated circuit devices, but it would be recognized that the invention has a much broader range of applicability.

Figure 1:
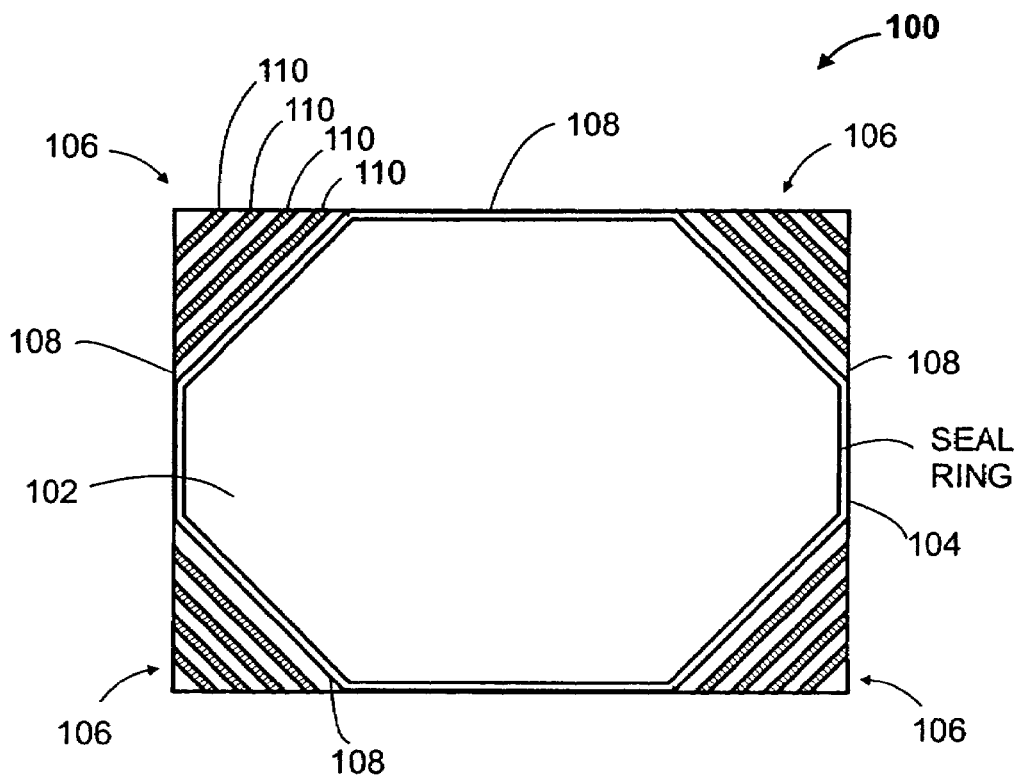
FIG. 1 is a simplified diagram illustrating an integrate circuit device according to an embodiment of the present invention.

FIG. 1 illustrates an integrated circuit device 100 according to an embodiment of the present invention. This diagram is merely an example, which should not unduly limit the scope of the claims. One of ordinary skill in the art would recognize many variations, alternatives, and modifications.

Integrate circuit device 100 includes a substrate and an overlying dielectric layer. The substrate can be a semiconductor. The dielectric layer can be a low k dielectric, such as plasma enhanced chemical vapor deposition (PECVD) silicon oxide, silicon nitride, silicon oxynitride, silicon carbide, flowable oxide (FOX), boron phosphorous silicon glass (BPSG), borosilica glass (BSG), polysilica glass (PSG), carbon doped silicon oxide, Black Diamond™ low k film from Applied Materials, Inc., Corel CVD dielectric from Novellus Systems Inc., SiLK dielectric resin from The Dow Chemical Company, or Aurora™ low-k dielectric from ASM International N.V.

Integrated circuit device 100 includes a seal ring 104 to protect an active region 102. Components of the integrated circuit (such as, transistors, diodes, resistors, capacitors, and the like) in active region 102 can be damaged by mechanical, electrical, and environmental stresses. For example, a sawing process to singulate integrate circuit device 100 from a wafer often induces delamination, cracking or chipping of integrated circuit devices, thus reducing manufacturing yield and device reliability. Seal ring 104 is disposed between a sawing trace 108 and active region 102, thus insulating active region 102 from stress associated with the sawing process. In FIG. 1, seal ring 104 is a polygon that provides for a sufficiently large corner region 106. In alternative embodiments, a seal ring can take any arbitrary shape, such as square, rectangle, rounded corner rectangle, oval, circle, or polygon. Similarly, an integrated circuit device can take any arbitrary shape, although a rectangular shape is preferred. In addition, an integrated circuit device can include a plurality of seal rings, for example, an inner seal ring and an outer seal ring.

Corner regions 106 of integrated circuit device 100 include a plurality of corner band stacks 110. The simplified diagram of FIG. 1 shows each corner region 106 having four corner band stacks 110. However, each corner region 106 may have any number of corner band stacks 110 (e.g., 5, 10, 15, 20, or more). In a typical embodiment, the number of corner band stacks per corner region may range from about 4 to about 300. Each corner band stack of a corner region run substantially in parallel to each other and in a predetermined angle. The predetermined angle can range from about 15 degrees to about 75 degrees in relation to sawing trace 108. The preferable predetermined angle is 45 degrees. Accordingly, any structural fault induced by the sawing process will generally run at the predetermined angle, or follow along a boundary of a corner band stack 110.

Figure 2:
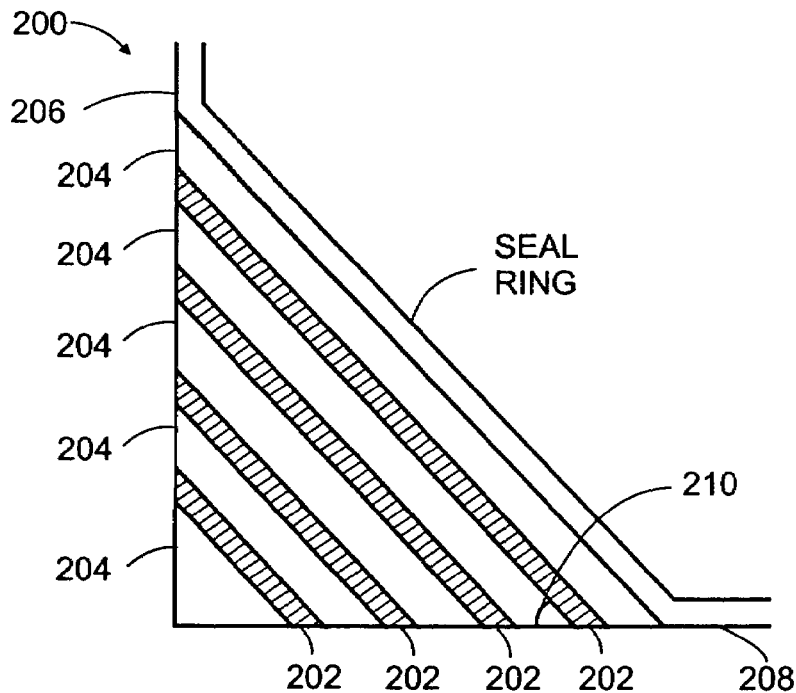
FIG. 2 illustrates simplified diagram of a corner region of an integrated circuit device according to an embodiment of the present invention.

FIG. 2 illustrates the corner region 200 of integrated circuit device according to an embodiment of the present invention. This diagram is merely an example, which should not unduly limit the scope of the claims. One of ordinary skill in the art would recognize many variations, alternatives, and modifications.

Corner region 200 includes a plurality of corner band stacks 202. Corner band stacks 202 are separated from each other by dielectric bands 204. Dielectric bands 204 are preferably of the same material as the dielectric layer of the integrated circuit device, and more preferably formed from the dielectric layer. However, in other embodiments, dielectric bands can be any low k dielectric material. The width of dielectric bands 204, and thus the separation between corner band stacks 204, ranges from about 0.1 microns to about 3 microns, or preferably from about 0.2 microns to about 1 micron. The length of corner band stacks 202 and dielectric bands 204 will vary based on position in corner region 106. In fact, these lengths depend on their relative position with respect to sawing traces 206 and 208, which define two boundaries of corner region 200. The third boundary of corner region 200 is defined by the seal ring.

During a sawing process to singulate an integrated circuit device from a wafer along sawing traces, mechanical stresses are more likely to cause damage (such as structural faults) to corner region 200 than in other region of an integrated circuit device. For example, the sawing process may produce cracks in corner region 200 or a portion thereof may even break off. Also, damaged areas can serve as the nucleus for delamination. Without corner band stacks 202, the damage could extend to the seal ring, and thus make an active area of the integrated circuit susceptible to delamination or environmental stresses. However, corner band stacks 202 each serve as a protective barrier in the corner region. In the event that one corner band stack fails, the seal ring (and thus the active area of the integrated circuit) can still be protected in the corner region by the remaining corner band stacks 202. It should be noted, that in a specific embodiment, corner band stacks 202 do not contact the seal ring and are not electrically coupled to a circuit, as they are more likely to be damaged. Each corner band stack defines a sacrificial portion of corner region 200.

Moreover, a structural fault is predisposed run at about a predetermined angle away from the seal ring. The fault will substantially follow a boundary of one of the corner band stacks 202. That is to say, for example, a path of a crack in corner region 206 will more likely run parallel to a corner band stack than through it. Each of corner band stacks 202 are disposed at an angle 210 from sawing trace 208. Angle 210 can range from about 15 degrees to about 75 degrees, and more preferably from about 30 degrees to about 60 degrees, and most preferably at about 45 degrees.

Figure 3:
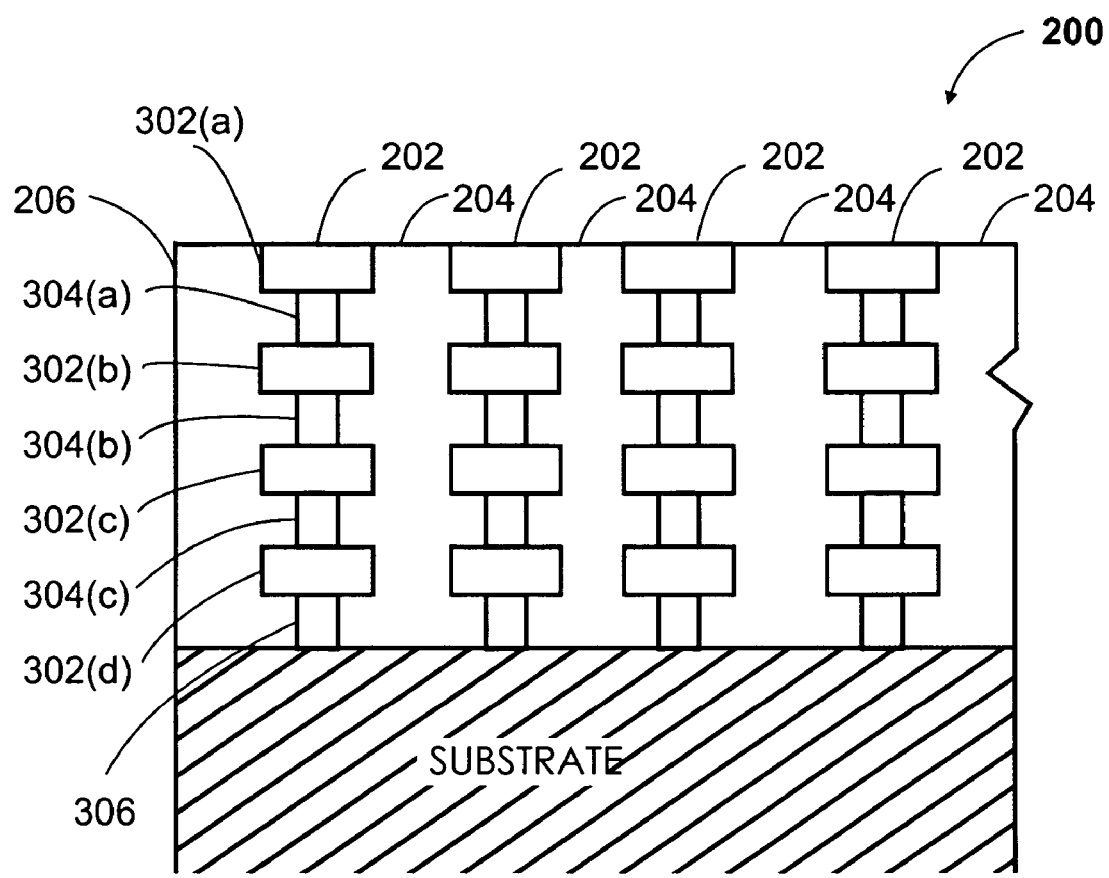
FIG. 3 illustrates a simplified diagram of a corner band stacks according to an embodiment of the present invention.

FIG. 3 illustrates corner band stacks 202 of an integrated circuit device according to an embodiment of the present invention. This diagram is merely an example, which should not unduly limit the scope of the claims. One of ordinary skill in the art would recognize many variations, alternatives, and modifications.

In an embodiment of the present invention, corner band stacks 202 each include two or more metal trace layers (e.g., five, ten, or more metal layers). In a specific embodiment, metal traces 302(a)-(d) can include copper, aluminum, tungsten, polysilicon, or combinations thereof. In addition, metal traces can have a width ranging from about 0.1 microns to about 3 microns, preferably about 0.2 microns to about 1 micron. Similarly, vias 304(a)-(c) and contact 306 can also include copper, aluminum, tungsten, polysilicon, or combinations thereof. The width of contact 306 and vias 304(a)-(d) can range about 0.05 microns to about 3 microns, preferably about 0.1 microns to about 0.5 microns. Spacing between adjacent vias (or adjacent contacts) ranges from about 0.05 microns to about 3 microns, preferably about 0.1 microns to about 0.5 microns. As shown in FIG. 3, metal traces 302(a)-(d), vias 304(a)-(c), and contact 306 of a corner band stack are organized to form a protective wall or barrier for stresses originating from, or through, sawing trace 206. In a specific embodiment, a barrier layer is provided between each of the metal trace layers and the dielectric layer. The barrier layer can include tantalum and/or tantalum nitride depending on the application.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device, the device comprising:
  a substrate, the substrate having a first edge and a second edge, the first edge and the second edge being intersecting edges of the substrate;
  an active circuit area;
  a single low-k dielectric layer overlying the substrate;

a seal ring disposed entirely in the single low-k dielectric layer, the seal ring being a hexagon shape surrounding the active circuit area as a protective boundary, the hexagon shape having a straight side extending entirely from a portion of the first edge to a portion of the second edge; and at least one corner area deposited in the single low-k dielectric layer and outside the seal ring, the at least one corner area comprising a plurality of corner band stacks, the plurality of corner band stacks separated from each other by one or more low-k dielectric bands that are formed from the single low-k dielectric layer, wherein each of the plurality of corner band stacks is oriented at about a predetermined angle and extends from the first edge to the second edge, the first edge including a first sawing trace and the second edge including a second sawing trace, wherein if a structural fault in the at least one corner area occurs, the structural fault is predisposed to extend at about the predetermined angle.

2. The device of claim 1 wherein the structural fault includes at least one of a crack, break, and chip.

3. The device of claim 1 wherein each of the plurality of corner band stacks comprise a plurality of metal traces coupled by at least one via between each of the plurality of metal traces, the plurality of metal traces are provided in the single low-k dielectric layer.

4. The device of claim 3 wherein the plurality of metal traces ranges from about 2 to about 14 layers.

5. The device of claim 3 wherein the plurality of metal traces each comprises a metal band having a width ranging from about 0.1 micron to about 3 microns of at least one of copper, aluminum, tungsten, and polysilicon.

6. The device of claim 3 wherein the at least one via comprises at least one of copper, aluminum, tungsten, and polysilicon having a width of ranging from about 0.1 micron to about 0.5 microns.

7. The device of claim 3 wherein each of the plurality of corner band stacks further comprise a contact having a width of about 0.1 micron to about 0.5 microns.

8. The device of claim 1 wherein the dielectric layer comprises at least one of PECYD silicon oxide, silicon nitride, silicon oxynitride, silicon carbide, flowable oxide (FOX), BPSG, BSG, PSG, and carbon doped silicon oxide.

9. The device of claim 1 wherein the seal ring forms at least one of a square, rectangle, rounded corner rectangle, oval, circle, and polygon around the active circuit area.

10. The device of claim 1 further comprising a buffer region in the dielectric layer between the active circuit area and the seal ring.

11. The device of claim 10 wherein the buffer region extends at least about 1 micron.

12. The device of claim 1 further comprising a baffler layer between the dielectric layer and each of the corner band stacks.

13. The device of claim 12 wherein the barrier layer comprises at least one of tantalum and tantalum nitride.

14. The device of claim 1 wherein the at least one corner region is four corner regions.

15. The device of claim 1 wherein the predetermined angle is about 45 degrees with respect to a sawing trace.

16. The device of claim 1 wherein the predetermined angle ranges from about 15 degrees to about 75 degrees with respect to a sawing trace.

17. An integrated circuit device, the device comprising:

a substrate, the substrate having a first edge and a second edge, the first edge and the second edge being intersecting edges of the substrate;

an active circuit area;

a single low-k dielectric layer overlying the substrate;

a seal ring disposed entirely in the single low-k dielectric layer, the seal ring being a hexagonal shape surrounding the active circuit area as a protective boundary, the hexagonal shape having a straight side extending entirely from the first edge to the second edge; and at least one corner area deposited in the single low-k dielectric layer and outside the seal ring, the at least one corner area comprising a plurality of corner band stacks, the plurality of corner band stacks separated from each other by one or more low-k dielectric bands that are formed from the single low-k dielectric layer, wherein each of the plurality of corner band stacks is oriented at about a predetermined angle and extends from the first edge to the second edge, the first edge including a first sawing trace and the second edge including a second sawing trace.

18. The device of claim 17 wherein the seal ring forms at least a shape of a square, a rectangle, a rounded corner rectangle, an oval, a circle, or a polygon around the active circuit area.

* * * * *